United States Patent
Chiang et al.

(10) Patent No.: US 7,371,634 B2
(45) Date of Patent: May 13, 2008

(54) AMORPHOUS CARBON CONTACT FILM FOR CONTACT HOLE ETCH PROCESS

(75) Inventors: Wen-Chuan Chiang, Hsin-Chu (TW); Cheng-Ku Chen, Hsin-Chu (TW); Mu-Chi Chiang, Hsin-Chu (TW); Min-Hwa Chi, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 517 days.

(21) Appl. No.: 11/048,485

(22) Filed: Jan. 31, 2005

(65) Prior Publication Data
US 2006/0170058 A1 Aug. 3, 2006

(51) Int. Cl.
*H01L 21/8238* (2006.01)

(52) U.S. Cl. .................. 438/233; 438/586; 438/592

(58) Field of Classification Search ........... 438/233, 438/586, 592
See application file for complete search history.

(56) References Cited

U.S. PATENT DOCUMENTS

2007/0200179 A1* 8/2007 Chen .................... 257/369

* cited by examiner

*Primary Examiner*—Jack Chen
(74) *Attorney, Agent, or Firm*—Tung & Associates

(57) ABSTRACT

A semiconductor device including a contact etch stop layer and contact hole formation method for reduced underlying material loss and improved device performance, the method including providing a semiconductor substrate including an active region including a CMOS device, STI structures, and metal silicide regions; forming a fluorine doped amorphous carbon layer over the active region; forming a PMD layer on the fluorine doped amorphous carbon layer; dry etching contact holes in the PMD layer to expose the fluorine doped amorphous carbon layer; and, removing the fluorine doped amorphous carbon layer according to a dry stripping process.

24 Claims, 6 Drawing Sheets

AMORPHOUS CARBON CONTACT FILM FOR CONTACT HOLE ETCH PROCESS

FIELD OF THE INVENTION

This invention generally relates to formation of MOSFET devices by integrated circuit manufacturing processes and more particularly to a contact film structure and method of forming the same including a contact hole etch process to reduce material loss of underlying layers including silicide contact regions and/or STI oxide regions.

BACKGROUND OF THE INVENTION

In the integrated circuit industry today, millions of semiconductor transistors are built on a single chip. As CMOS transistors, also referred to as MOSFETs, are scaled down in size, one of the most important challenges facing a device designer are short channel effects (SCE) in reduced gate length devices. It is well-known that short channel effects of MOSFET devices include $V_T$ roll-off, drain induced barrier lowering (DIBL), subthreshold swing degradation, gate-to-drain overlap capacitance and gate-induced-drain-leakage (GIDL) current. Short channel effects (SCE) are a function of several processing parameters including width and depth of S/D regions and S/D region dopant concentration profiles. For example, since SCE is related to the junction depth (xj), shallower S/D junction depths with lighter doping can improve transistor operating characteristics.

The formation of contact holes to form electrical connections to source/drain regions and/or gate electrodes in a typical CMOS process flow include depositing nitride contact etch stop layers over the process surface after the formation of silicided source/drain regions and/or gate electrodes. A pre-metal dielectric (PMD) layer is then deposited and followed by formation of a contact hole to the source/drain regions and/or gate electrodes by masking and dry etching process steps.

One problem in the prior art process is unintentional yet difficult to avoid removal of underlying critical material layers during dry etching process step in a uniform manner, such as silicide regions and (shallow trench isolation (STI) oxide regions, for example at the STI edge. As a result, the formation of shallow source/drain junctions is increasingly problematical due to the difficulty in controlling overetch phenomenon in nitride etch stop layers. For example overetching underlying silicide and STI oxide regions leads to increased junction leakage and even shorts to substrate, thereby compromising device reliability, performance and yield. Moreover, conventional nitride material formation processes have been found to contribute to the presence of hydrogen which can form charge carrier traps in nearby gate dielectric by diffusive transport leading to degraded reliability and performance including hot carrier induced degradation, Fowler-Nordheim tunneling.

These and other shortcomings demonstrate a need in the MOSFET integrated circuit manufacturing art for improved contact etch stop layers and methods for forming the same including contact hole formation to improve CMOS device performance, reliability, and yield.

It is therefore an object of the present invention to provide improved contact etch stop layers and methods for forming the same including contact hole formation to improve CMOS device performance, reliability, and yield, in addition to overcoming other shortcomings of the prior art.

SUMMARY OF THE INVENTION

To achieve the foregoing and other objects, and in accordance with the purposes of the present invention, as embodied and broadly described herein, the present invention provides a semiconductor device including a new contact etch stop layer and contact hole formation method for reduced underlying material loss and improved device performance.

In a first embodiment, the method includes providing a semiconductor substrate including an active region including a CMOS device, STI structures, and metal silicide regions; forming a fluorine doped amorphous carbon layer over the substrate; forming a PMD layer on the fluorine doped amorphous carbon layer; masking and dry etching contact holes in the PMD layer to expose the fluorine doped amorphous carbon layer; and, removing the fluorine doped amorphous carbon layer according to a dry stripping process.

These and other embodiments, aspects and features of the invention will be better understood from a detailed description of the preferred embodiments, which are further described below in conjunction with the accompanying Figures.

DETAILED DESCRIPTION OF THE PREFERRED EMBODIMENTS

Although the method of the present invention is explained with reference to an exemplary MOSFET devices, it will be appreciated that the present invention may be applied to the formation of any CMOS device whereby a contact etch stop layer formed of fluorine doped amorphous carbon is provided allowing improved device performance as well as the advantageous implementation of the associated contact hole formation process to reduce loss of critical underlying material including silicided CMOS device contact regions and shallow trench isolation (STI) regions.

Figure 1A:
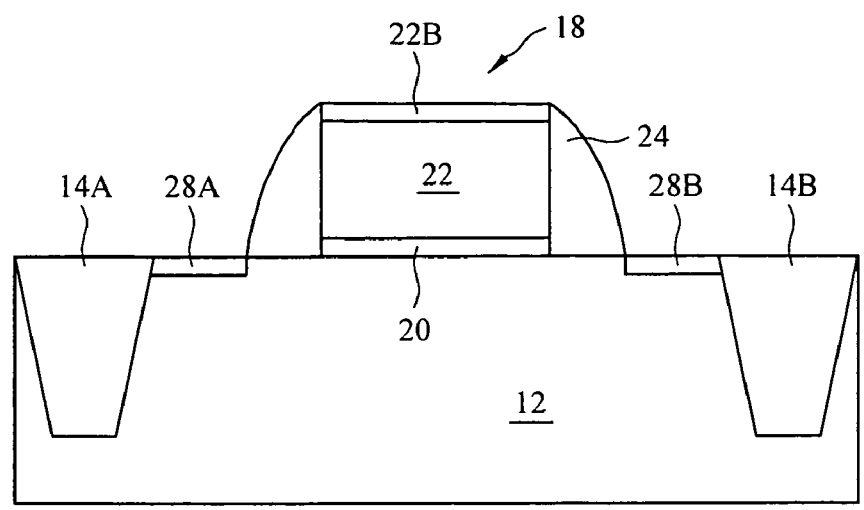
FIGS. 1A-1F are cross sectional schematic views of exemplary portions of a semiconductor process wafer including a CMOS device at stages of manufacture according to an embodiment of the present invention.

Now, referring to FIG. 1A, is shown a semiconductor substrate 12, which may include silicon, strained semiconductor, compound semiconductor, multi-layered semiconductors, or combinations thereof. More specifically, the substrate 12 may include, but is not limited to, silicon on insulator (SOI), stacked SOI (SSOI), stacked SiGe on insulator (S—SiGeOI), SiGeOI, and GeOI, or combinations thereof. In a preferred embodiment, the substrate is formed of silicon including doped well regions making up an active device region formed by conventional ion implantation methods.

Still referring to FIG. 1A, shallow trench isolation (STI) structures e.g., 14A and 14B are formed in the semiconductor substrate 12 on either side of the active region by conventional processes including backfilling with an HDP-CVD oxide or PECVD silicon oxide and planarizing by chemical-mechanical polishing (CMP).

Still referring to FIG. 1A, MOSFET device e.g., PMOS or NMOS transistor 18 is then formed by conventional processes. For example, the gate structure is formed by first forming a gate dielectric portion 20, followed by forming overlying gate electrode portion 22 by deposition of gate conduction material, masking, and dry etching steps.

The gate dielectric portion 20 may be formed of silicon oxide, silicon oxynitride, silicon nitride, nitrogen doped silicon oxide, high-K dielectrics, or combinations thereof. The high-K dielectrics may include metal oxides, metal silicates, metal nitrides, transition metal-oxides, transition metal silicates, metal aluminates, and transition metal nitrides, or combinations thereof. The gate dielectric may be formed by any process known in the art, e.g., thermal oxidation, nitridation, sputter deposition, or chemical vapor deposition. The physical thickness of the gate dielectric may be in the range of 5 to 100 Angstroms in CMOS technology node of 90 nm. When using a high permittivity (high-K) gate dielectric, the dielectric constant is preferably greater than about 8. The high-K dielectric may be selected from a group comprising aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

The gate electrode portion 22 may be formed of doped polysilicon, polysilicon-germanium, metals, metal silicides, metal nitrides, or conductive metal oxides. In a preferred embodiment, the gate electrode is formed of doped polysilicon.

Still referring to FIG. 1A, spacers 24, are formed along either side of the gate structure and may be formed of oxide and/or nitride materials such as silicon oxide, silicon nitride (e.g., $Si_3N_4$) and/or silicon oxynitride (SiON), formed by CVD or PECVD deposition methods followed by dry etch-back to form self-aligned spacers on either side of the gate structure. In addition, ion implanted source and drain (S/D) regions (not shown) are preferably formed in the substrate, adjacent the gate structure following formation of spacers 24.

Still referring to FIG. 1A, the self aligned silicide regions (salicides) 28A, 28B may be formed by conventional processes over the S/D regions and over the upper portion of the gate electrode 22B. The silicide regions may be formed of any metal silicide including $TiSi_2$, $CoSi_2$, and NiSi.

Figure 1B:
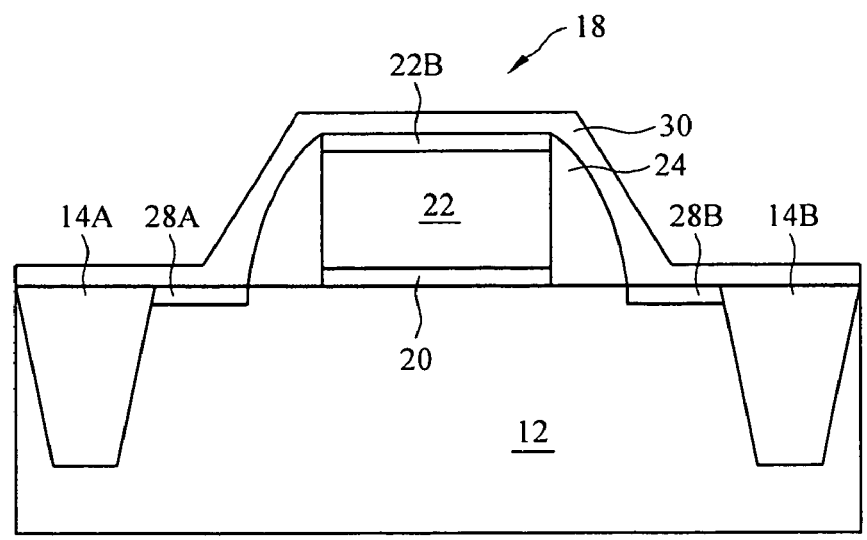

Referring to FIG. 1B, in an important aspect of the invention a fluorine doped amorphous carbon contact etch stop layer (CESL) 30 is formed over the process surface including the CMOS device. The amorphous carbon layer 30 is preferably formed by PVD, CVD or plasma assisted methods, most preferably PVD sputtering, for example using a fluorine source target and a carbon source target such as graphite, preferably at a temperature of from about 25° C. to about 400° C. The fluorine source target may include fluorine containing polymers such as polytetrafluoroethylene (PTFE) and the carbon source may be a trigonally bonded carbon source such as a graphite containing target to preferably form primarily tetrahedrally bonded carbon in the fluorine doped amorphous carbon layer. The amorphous carbon CESL 30 is preferably formed having a fluorine concentration of from about 10 atomic weight % to about 60 atomic weight %, more preferably from about 20 atomic weight % to about 45 atomic weight %.

The thickness of the fluorine doped amorphous carbon layer 30 is preferably from about 50 Angstroms to about 500 Angstroms, more preferably from about 50 Angstroms to about 300 Angstroms. Advantageously, the fluorine doped amorphous carbon layer is preferably formed with a compressive stress of less than about 200 MPa, a dielectric constant of less than about 2.8, and without hydrogen (free of hydrogen), all of which improve device performance, reliability, and yield.

Figure 1C:
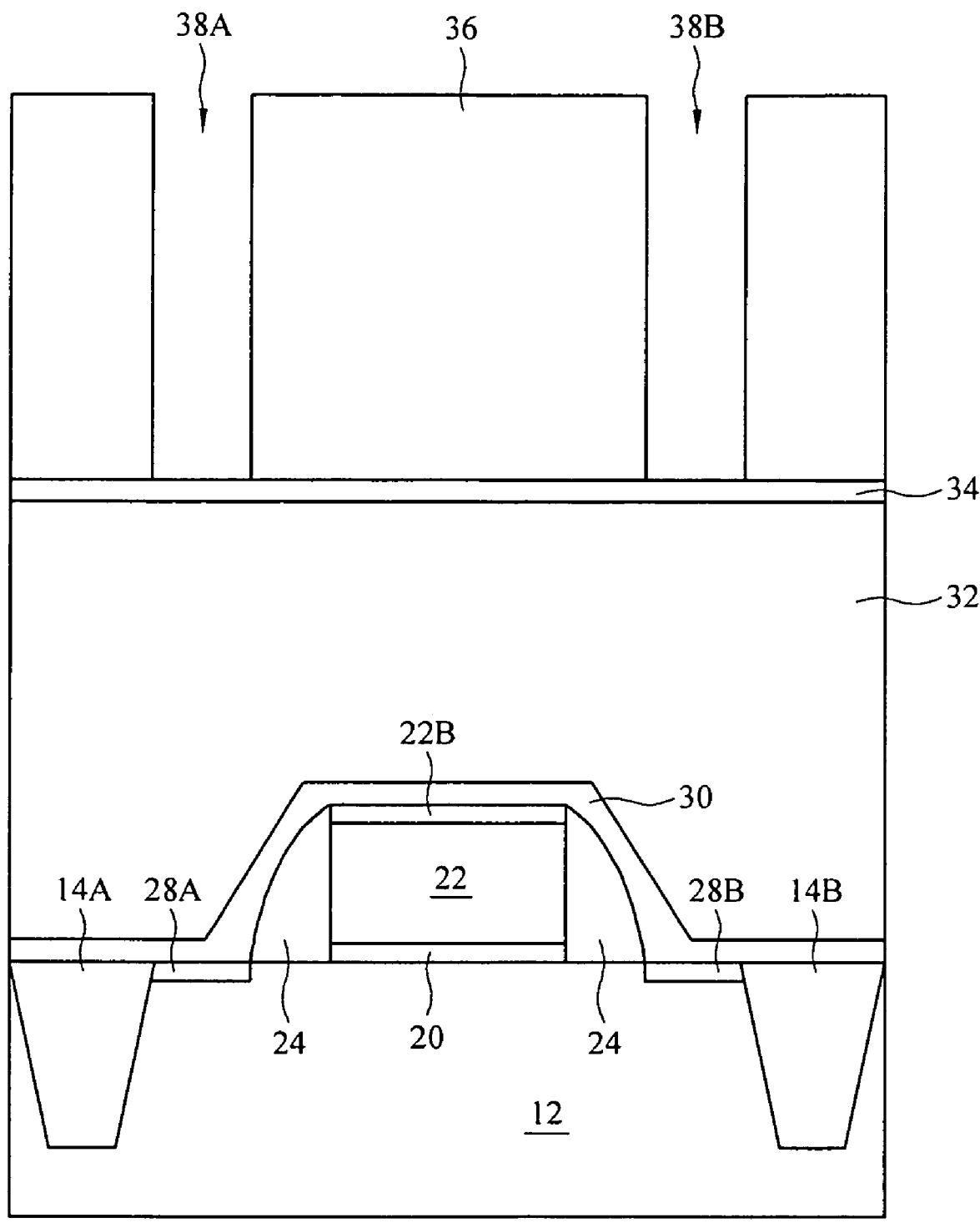

Referring to FIG. 1C, a dielectric insulating layer 32, also referred to as a pre-metal dielectric (PMD) layer, is formed over the CESL layer. The PMD layer 32 is preferably a silicon oxide containing layer formed of doped or undoped silicon oxide formed by a thermal CVD process, e.g., undoped silicate glass (USG) or phosphorous doped silicate glass (PSG). Alternatively, the PMD layer 32 may be formed of doped or P-doped spin-on-glass (SOG), P-doped SOG, PTEOS, or BPTEOS, but is most preferably formed of PSG. Following planarization by CMP of the PMD layer 32, a bottom anti-reflectance coating (BARC) 34, preferably a spin-on organic layer, is then formed on the PMD layer 32, followed by formation of a lithographically patterned photoresist layer 36, patterned with openings 38A, 38B for etching contact holes.

Figure 1D:
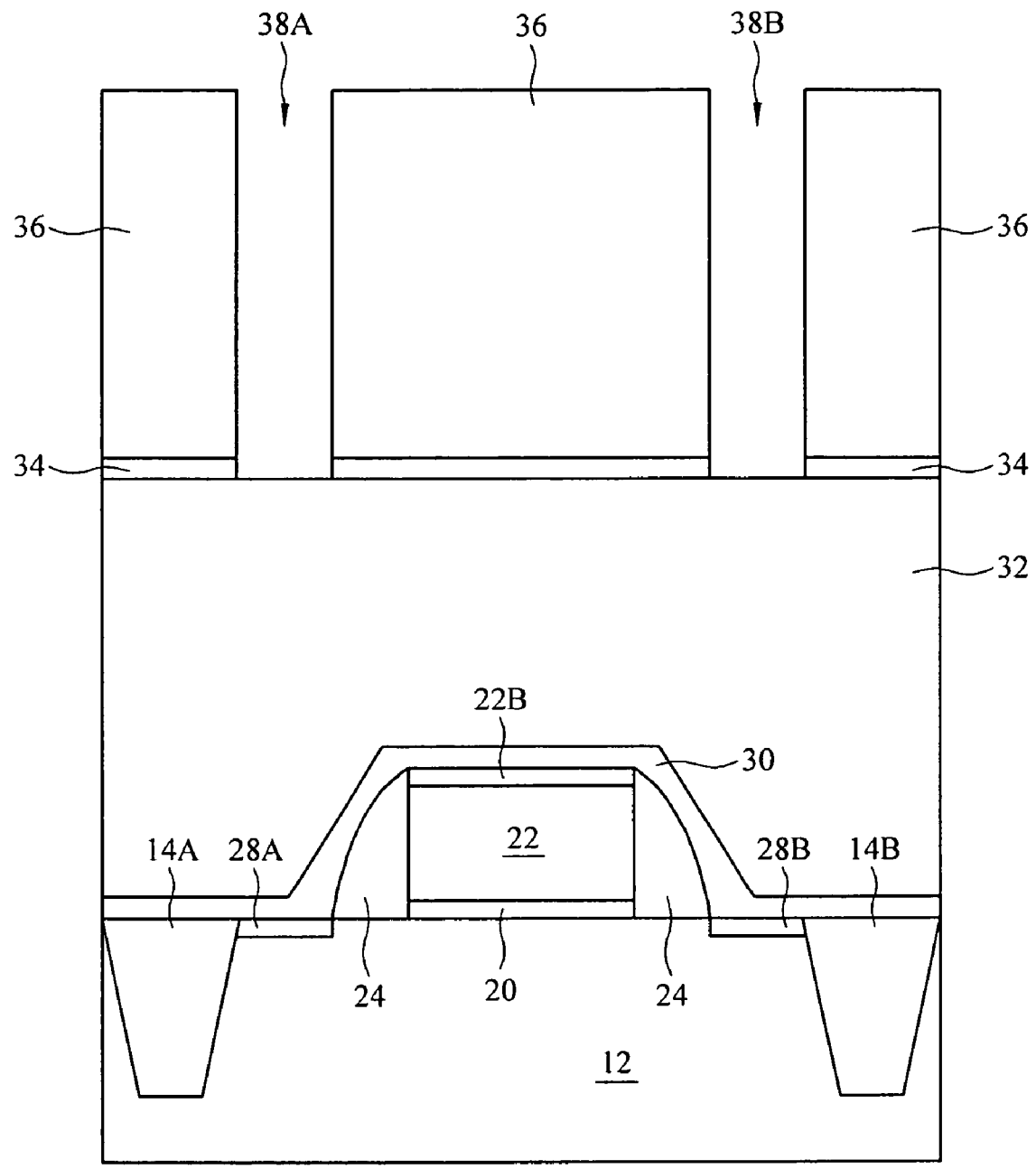

Referring to FIG. 1D, in an important aspect of the invention, a three-step dry etching process, preferably carried out in-situ with respect to one another, is then carried out to extend contact openings 38A and 38B to source/drain salicide regions 28A, 28B. It will be appreciated that contact openings may also be formed to the gate electrode contact region e.g., salicide region 22B. In a first step, a BARC open etch is performed to etch through the BARC layer 34 by using a fluorocarbon and hydrofluorocarbon etching chemistry such as plasma source gases $C_4F_6$ and/or $C_4F_8$ together with $CF_4$. Alternatively, a hydrofluorocarbon etching chemistry such as $CH_2F_2$ together with $O_2$ and argon plasma source gases may be used. Exemplary plasma etching pressures are from about 50 mTorr to about 200 mTorr.

Figure 1E:
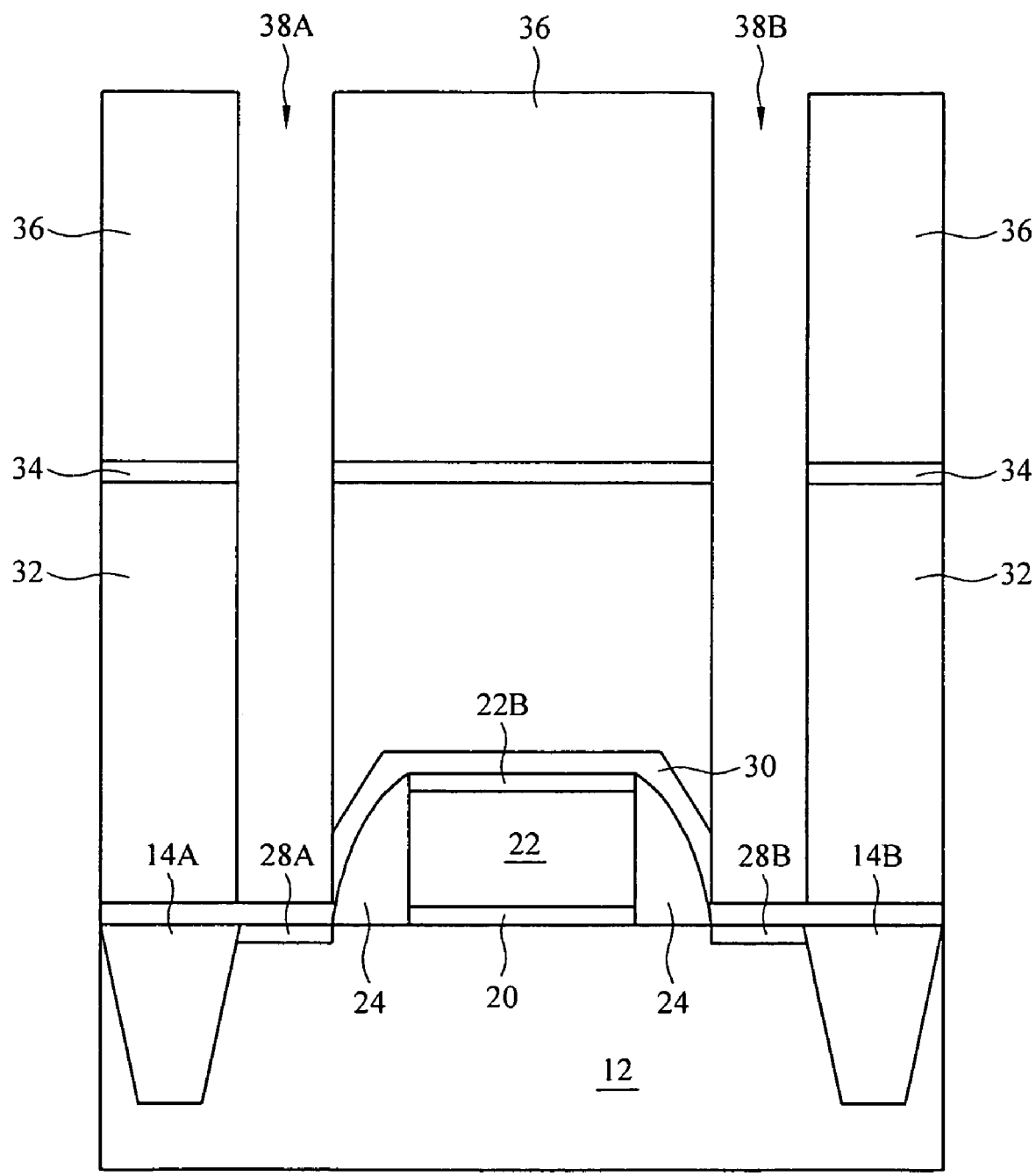

Referring to FIG. 1E, in a second etching step, the PMD layer 32 is then etched through to expose the fluorine doped amorphous carbon layer (CESL) 30 overlying silicide contact regions 28A and 28B. The same preferred plasma source gases as outlined for the BARC layer may be used but with lower plasma pressures from about 4 mTorr to about 75 mTorr and preferably with a sufficient volumetric concentration of the hydrofluorocarbon plasma source gases to achieve a high in-situ polymer generation rate to form polymer deposits (not shown) on etched opening sidewalls to increase an etching selectivity with respect to the photoresist. For example a volumetric flow rate of hydrofluorocarbon to CF4 is from about 5:1 to about 2:1 and a volumetric flow rate of hydrofluorocarbon to $O_2$ or CO is from about 1:100 to about 1:150. The increased etching selectivity, of the PMD layer 32 with respect to the photoresist 36 is particularly important for characteristic device dimensions of less than about 90 nm. In addition, the PMD etching chemistry is preferably tuned with a good selectivity with respect to the fluorine doped amorphous carbon layer from about 10 to 15.

Figure 1F:
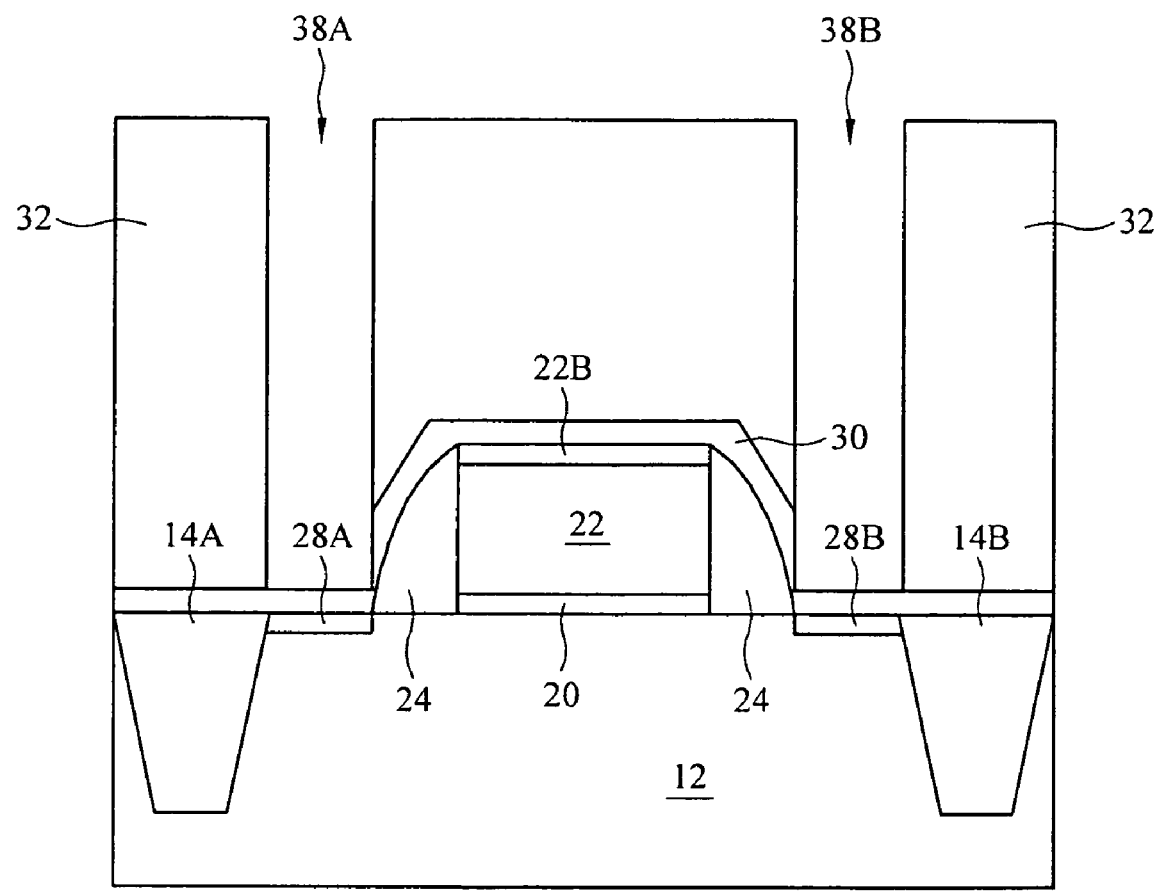

Referring to FIG. 1F, in the third step of the in-situ three-step dry etching process, the photoresist layer 36, the BARC layer 34, the fluorine doped amorphous carbon layer 30 are removed simultaneously in a dry stripping process using a dry stripping chemistry of $H_2$ and $O_2$ and/or CO plasma source gases, preferably with a volumetric flow ratio of $H_2$ to $O_2$ and/or CO of about 1:1 to about 1:10, an RF power source of about 800 Watts to about 1200 Watts, a bias RF power of about 30 Watts to about 70 Watts and a plasma process pressure of less than about 50 mTorr. Advantageously, there is negligible loss of critical material layers underlying the fluorine doped amorphous carbon layer 30, including metal silicide regions 28A and 28, or oxide from adjacent STI regions 14A and 14B, in the case of slight misalignment of the contact holes. Note that the capability of stripping fluorine doped amorphous carbon the same way as photo-resist and BARC results in the unique process step to possibly strip the photo-resist, BARC and contact etch-stop layer simultaneously.

Following the formation of the contact holes using fluorine doped amorphous carbon as etch-stop layer in this invention conventional processes are followed to backfill the contact openings 38A and 38B with metal tungsten.

Thus, a contact etch stop layer and in-situ etching method for forming contact holes has been presented with several advantages over the prior art including negligible loss of underlying critical material layers thereby making the formation of shallower source/drain regions and avoiding device reliability and performance due to STI oxide loss. Moreover, the fluorine doped amorphous carbon (CESL) according to an aspect of the invention can be formed at low temperatures thereby avoiding undesirable source/drain region dopant diffusion as well as having the advantage of being free of hydrogen in contrast to conventional nitride or oxynitride serving as the etch-stop layer of the prior art. As a result, performance degradation associated with hydrogen diffusion to form trapping states and hot carrier induced degradation in the gate dielectric is advantageously avoided. Moreover, the process flow including a three step dry etching and stripping process can be carried out in-situ to improve the controllability of a process flow and manufacturing throughput with low cost.

Figure 2:
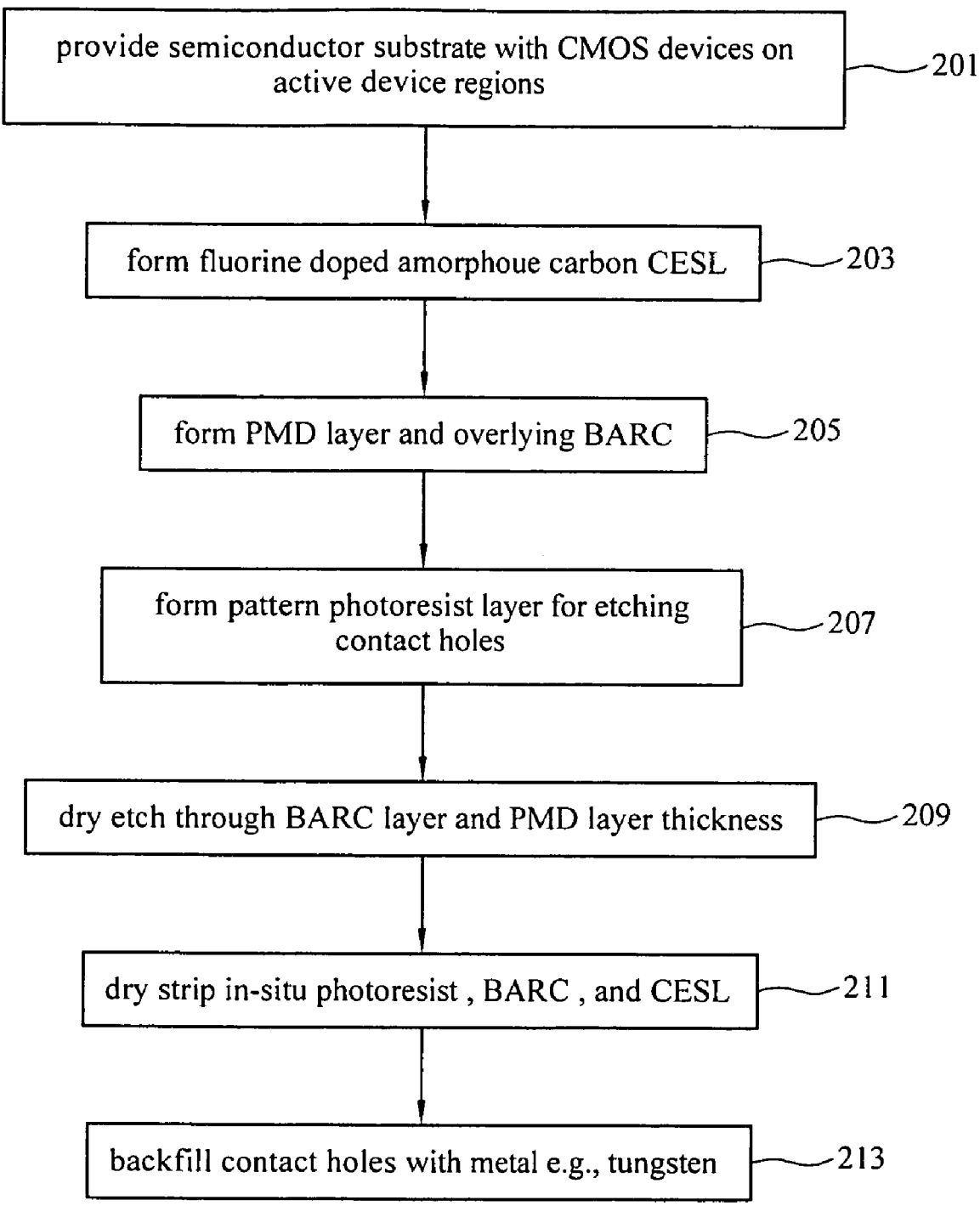
FIG. 2 is a process flow diagram including several embodiments of the present invention.

Referring to FIG. 2 is a process flow diagram including several embodiments of the present invention. In process 201, a semiconductor substrate is provided having active CMOS devices including silicide and STI oxide regions. In process 203, a fluorine doped amorphous carbon contact etch stop layer is deposited over the substrate from 201 according to preferred embodiments. In process 205, a PMD layer with an overlying BARC layer is formed on the CESL layer from 203. In process 207, a photolithographic patterning process including forming a patterned photoresist layer to form contact holes is carried out. In process 209, an in-situ etching process according to preferred embodiments is carried out to etch through the BARC layer and etch through the PMD layer thickness to expose the fluorine doped amorphous carbon layer. In process 211, an in-situ dry stripping process is carried out to simultaneously remove the photoresist layer, the BARC layer, and the fluorine doped amorphous carbon layer to expose the silicide regions. In process 213, the contact holes are backfilled with metal e.g., tungsten, The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of forming a contact hole with reduced material loss underlying a contact etch stop layer comprising the steps of:
   providing a semiconductor substrate comprising an active region comprising a CMOS device, STI structures, and metal silicide regions;
   forming a fluorine doped amorphous carbon layer over the active region;
   forming a PMD layer on the fluorine doped amorphous carbon layer;
   dry etching contact holes in the PMD layer to expose the fluorine doped amorphous carbon layer; and,
   removing the fluorine doped amorphous carbon layer according to a dry stripping process.

2. The method of claim 1, wherein the step of dry etching and removing the fluorine doped amorphous carbon layer are performed in-situ.

3. The method of claim 1, further comprising the steps following forming a PMD layer and prior to dry etching of:
   forming an organic BARC layer on the PMD layer; and,
   forming a patterned photoresist layer for etching contact holes.

4. The method of claim 3, wherein the step of removing the fluorine doped amorphous carbon layer comprises simultaneously removing the photoresist layer and the BARC layer.

5. The method of claim 1, wherein the dry stripping process comprises hydrogen ($H_2$) plasma source gas and an oxygen atom plasma source gas.

6. The method of claim 5, wherein the oxygen atom plasma source gas is selected from the group consisting of $O_2$ and CO.

7. The method of claim 1, wherein the fluorine doped amorphous carbon layer is formed comprising tetrahedrally bonded carbon atoms.

8. The method of claim 1, wherein the fluorine doped amorphous carbon layer is formed essentially free of hydrogen.

9. The method of claim 1, wherein the fluorine doped amorphous carbon layer is formed by a PVD sputtering process at a temperature from about 25° C. to about 400° C.

10. The method of claim 1, wherein the fluorine doped amorphous carbon layer is formed having a fluorine content of about 10 atomic wt % to about 65 atomic wt %.

11. The method of claim 1, wherein the PMD layer is formed of a material selected from the group consisting of undoped silicate glass (USG), phosphorous doped silicate glass (PSG), spin on glass (SOG), and phosphorous doped spin on glass (PSOG), PTEOS, and BPTEOS.

12. The method of claim 1, wherein the PMD layer consists essentially of PSG.

13. The method of claim 1, wherein step of dry etching contact holes comprises plasma source gases selected from the group consisting of hydrofluorocarbons, fluorocarbons, oxygen, and argon.

14. The method of claim 1, wherein step of dry etching contact holes comprises hydrofluorocarbon plasma source gases selected from the group consisting of $C_4F_6$, $C_4F_8$, and $CH_2F_2$.

15. The method of claim 14, wherein the step of dry etching contact holes comprises in-situ formation of a carbon and fluorine containing polymer on an etching surface.

16. A method of forming a contact hole with reduced material loss underlying a contact etch stop layer and improved device performance comprising the steps of:
   providing a semiconductor substrate comprising an active region comprising a CMOS device, STI structures, and metal silicide regions;
   forming a hydrogen free fluorine doped amorphous carbon layer over the active region;
   forming a PMD layer on the hydrogen free fluorine doped amorphous carbon layer;
   dry etching contact holes in the PMD layer to expose the fluorine doped amorphous carbon layer; and,
   removing the hydrogen free fluorine doped amorphous carbon layer in-situ according to a dry stripping process.

17. The method of claim 16, further comprising the steps following forming a PMD layer and prior to dry etching of:
forming an organic BARC layer on the END layer; and,
forming a patterned photoresist layer for etching contact holes.

18. The method of claim 17, wherein the step of removing the hydrogen free fluorine doped amorphous carbon layer comprises simultaneously removing the photoresist layer and the BARC layer.

19. The method of claim 16, wherein the dry stripping process comprises hydrogen ($H_2$) plasma source gas and an oxygen atom source selected from the group consisting of $O_2$ and CO.

20. The method of claim 16, wherein the fluorine doped amorphous carbon layer is formed by a PVD sputtering process at a temperature from about 25° C. to about 400° C.

21. The method of claim 16, wherein the fluorine doped amorphous carbon layer is formed having a fluorine content of about 20 atomic wt % to about 45 atomic wt %.

22. The method of claim 16, wherein the PMD layer consists essentially of PSG.

23. The method of claim 16, wherein step of dry etching contact holes comprises hydrofluorocarbon plasma source gases selected from the group consisting of $C_4F_6$, $C_4F_8$, and $CH_2F_2$.

24. The method of claim 23, wherein the step of dry etching contact holes comprises in-situ formation of a carbon and fluorine containing polymer on etched opening sidewalls.

* * * * *